United States Patent [19]
Allan

[11] Patent Number: 5,729,160
[45] Date of Patent: Mar. 17, 1998

[54] SELF-TIMED CIRCUIT CONTROL DEVICE AND METHOD

[75] Inventor: Graham A. Allan, Stittsville, Canada

[73] Assignee: Mosaid Technologies Incorporated, Kanata, Canada

[21] Appl. No.: 277,580

[22] Filed: Jul. 20, 1994

[51] Int. Cl.6 .................. H03K 3/356; H03K 0/013; G11C 8/00
[52] U.S. Cl. ........................... 327/54; 365/230.08
[58] Field of Search ...................... 327/51, 52, 54, 327/56, 57; 365/189.02, 159.04, 195, 196, 230.02, 230.06, 230.08

[56] References Cited

U.S. PATENT DOCUMENTS

| | | | |
|---|---|---|---|
| 4,599,707 | 7/1986 | Fang | 365/195 |
| 5,015,891 | 5/1991 | Choi | 327/54 |
| 5,107,465 | 4/1992 | Fung et al. | 365/230.08 |
| 5,155,397 | 10/1992 | Fassino et al. | 327/54 |
| 5,160,864 | 11/1992 | Lee | 327/51 |
| 5,289,430 | 2/1994 | Tran | 365/189.05 |
| 5,306,970 | 4/1994 | Phillips | 327/57 |
| 5,357,477 | 10/1994 | Matsumoto et al. | 365/230.02 |
| 5,361,343 | 11/1994 | Kosonocky et al. | 365/189.02 |
| 5,365,489 | 11/1994 | Jeong | 365/230.02 |
| 5,402,010 | 3/1995 | Muraoka | 327/51 |

*Primary Examiner*—Timothy P. Callahan
*Assistant Examiner*—T. Lam
*Attorney, Agent, or Firm*—Brian W. Gray; Alfred A. Macchione

[57] ABSTRACT

A device and method for self-timed, temporary disabling or latching of an electric circuit. A first portion of the circuit has sensing means for sensing a change in the value of an output signal of a second circuit portion corresponding to a change between logic states. The first circuit portion also includes immobilizing means responsive to the sensing means for temporarily disabling or latching the second circuit portion. The immobilizing means functions after such a change in logic state has occurred and, in addition, when the output signal of the second circuit portion has acquired a value corresponding to a predetermined logic state. Disabling occurs when the immobilizing means turns off a switch of the second portion. Latching occurs when the immobilizing means activates latch means of the second portion, thereby fixing voltage level(s) and corresponding logic state(s).

18 Claims, 8 Drawing Sheets

TRUTH TABLE

| RMA | RDB | RDB* | PRMA |
|-----|-----|------|------|
| 0 | X | X | 0 |
| 1 | 1 | 1 | 1 |
| 1 | 0 | 1 | 0 |
| 1 | 1 | 0 | 0 |
| 1 | 0 | 0 | 0* |

\* NOTE
RDB = RDB = 0
MAY BE AN INVALID
STATE

SELF-TIMED CIRCUIT CONTROL DEVICE AND METHOD

FIELD OF THE INVENTION

This relates to devices and methods for self-timed, temporary disabling or latching of electric circuits.

BACKGROUND OF THE INVENTION

Conventionally, a portion of a dynamic random access memory (DRAM) electronic circuit operates in the following sequence: (a) a selected wordline(s) rises; (b) accessed bitline pairs (also known as columns) establish small differential voltages as each accessed cell's charge is shared with the associated bitline; (c) each active column's voltage differential is amplified by a regenerative bitline sense amplifier; (d) column access circuitry connects the selected bitline pairs (columns) to the databus pairs; (e) the databus voltage differential is amplified by a read sense amplifier that drives read databuses; and (f) the read databuses drive the data output buffer(s) and the data is presented to the data output pin(s).

The timing of step (e) is important. If amplification occurs too early, the read sense amplifier may not be reliably able to sense a poor differential input signal. If amplification occurs too late, the electronic circuit will be unnecessarily slow.

The signal used to enable the read sense amplifier is typically a convenient signal associated with the timing of the bitline sense amplifiers or the column access circuitry. Usually, this signal is a self-timed pulse that is simply a delayed version of a previous clock. A pulsed waveform is used to enable the sense amplifier temporarily, for as long as is required to achieve acceptable voltage levels for the next stage of the circuit (usually full CMOS levels). Prior to disabling the sense amplifier, the outputs are latched to maintain the voltage level after the sense amplifier enters a Hi-Z state.

If the pulse used to enable the sense amplifier is too short, the read databuses may not provide an adequate signal for the data output buffer. If the pulse used to enable the sense amplifier is too long, power will be wasted in the sense amplifier, as it will remain enabled after it has performed its task. In practice, the latter situation occurs as electronic circuits are typically designed to perform in a worst case scenario, and a margin of error is incorporated in the design. Thus, power is wasted when the sense amplifier is not operating at the outer limits of its operative capability. It is not uncommon to find up to sixteen of these circuits operating in parallel with each being capable of consuming a large amount of current when active.

Current systems do not provide means to reduce the power consumption of a CMOS differential sense amplifier as used in a DRAM or to control more accurately the sense amplifier as process parameters such as temperature and power supply voltage vary or fluctuate. Such control would also be desirable for other electrical applications, for example, in the simultaneous control of two or more parallel circuits while the output of only one of the circuits is sampled, and in the enabling or activating of a latch in a DRAM that uses multiplexed address buffers and predecoders.

SUMMARY OF THE INVENTION

In a first aspect, the present invention provides a self-timed electric circuit including a first electric circuit portion having switch means adapted to enable the second circuit portion when the switch means is turned on, and a second electric circuit portion. The second circuit portion includes: sensing means for sensing a change in an output signal of the first circuit portion, the change corresponding to a change between logic states; and immobilizing means responsive to the sensing means for temporarily disabling the first circuit portion by turning off the switch means. An input terminal of the second electric circuit portion is connected to an output terminal of the first electric circuit portion, and an output terminal of the second electric circuit portion is connected to the switch means. The immobilizing means disables the first circuit portion when the sensing means signals the change in logic state and the output signal of the first circuit portion has acquired a value corresponding to a predetermined logic state.

In a second aspect, the invention provides a self-timed electric circuit including a first electric circuit portion and a second electric circuit portion having latch means adapted to latch at least one output of the first circuit portion when the latch means is activated. The second circuit portion includes: sensing means for sensing a change in the at least one output signal of the first circuit portion, the change corresponding to a change between logic states; and immobilizing means responsive to the sensing means for temporarily latching an output of the first circuit portion by activating the latch means. An input terminal of the second electric circuit portion is connected to an output terminal of the first electric circuit portion, and an output terminal of the second electric circuit portion is connected to the latch means. The immobilizing means latches the at least one output of the first circuit portion when the sensing means signals the change in logic state and the at least one output signal of the first circuit portion has acquired a value corresponding to a predetermined logic state.

In other aspects, the invention provides a second circuit portion as described for the circuits above.

In a further aspect, the invention provides a method of temporarily disabling an electric circuit portion having switch means adapted to enable the circuit portion when the switch means is turned on. The method uses a self-timed control mechanism and includes the steps of: (a) sensing the value of an output signal of the circuit portion to determine when a change between logic states occurs; and (b) when the change has occurred and the output signal of the circuit portion has acquired a value that corresponds to a predetermined logic state, sending a signal to the switch means to turn the switch means off. Preferably, the self-timed signal to the switch means is able to override an external signal to the switch means to turn on.

In a still further aspect, the invention provides a method of temporarily latching an electric circuit portion having latch means adapted to latch at least one output of the circuit portion when the latch means is activated. The method uses a self-timed control mechanism and includes the steps of: (a) sensing the value of the at least one output signal of the circuit portion to determine when a change corresponding to a change between logic states occurs; and (b) when the change has occurred and the at least one output signal of the circuit portion has acquired a value that corresponds to a predetermined logic state, sending a signal to the latch means to activate the latch means.

In a still further aspect, the invention provides a self-timed control mechanism for a CMOS sense amplifier having two output terminals and a switch transistor biased for turning the sense amplifier on and off in response to signals with values corresponding respectively to logic 1 and 0. The mechanism includes: (a) a NAND logic gate having two input terminals and an output terminal, each input terminal being connected to a respective sense amplifier output terminal that is precharged to logic 1; (b) a NOR logic gate having first and second input terminals and an output terminal, the first input terminal being connected to the output terminal of the NAND gate and the output terminal being connected to a gate of the switch transistor; and (c) an inverting logic gate having an input terminal for receiving an externally generated generally square periodic waveform whose value alternates between values corresponding to logic 1 and logic 0, and an output terminal that is connected to the second input terminal of the NOR gate.

In yet another aspect, the invention provides a self-timed control mechanism for a CMOS DRAM having multiplexed address buffers and predecoders, at least two row address lines, and latch means. The mechanism includes an OR logic gate having at least two input terminals and an output terminal, each input terminal being connected to a respective row address line that is precharged to a voltage level corresponding to logic 0.

BRIEF DESCRIPTION OF THE DRAWINGS

For a better understanding of the present invention and to show more clearly how it may be carried into effect, reference will now be made to the accompanying drawings, which show a device according to the preferred embodiment of the invention and in which.

DETAILED DESCRIPTION OF A PREFERRED EMBODIMENT

Figure 1:
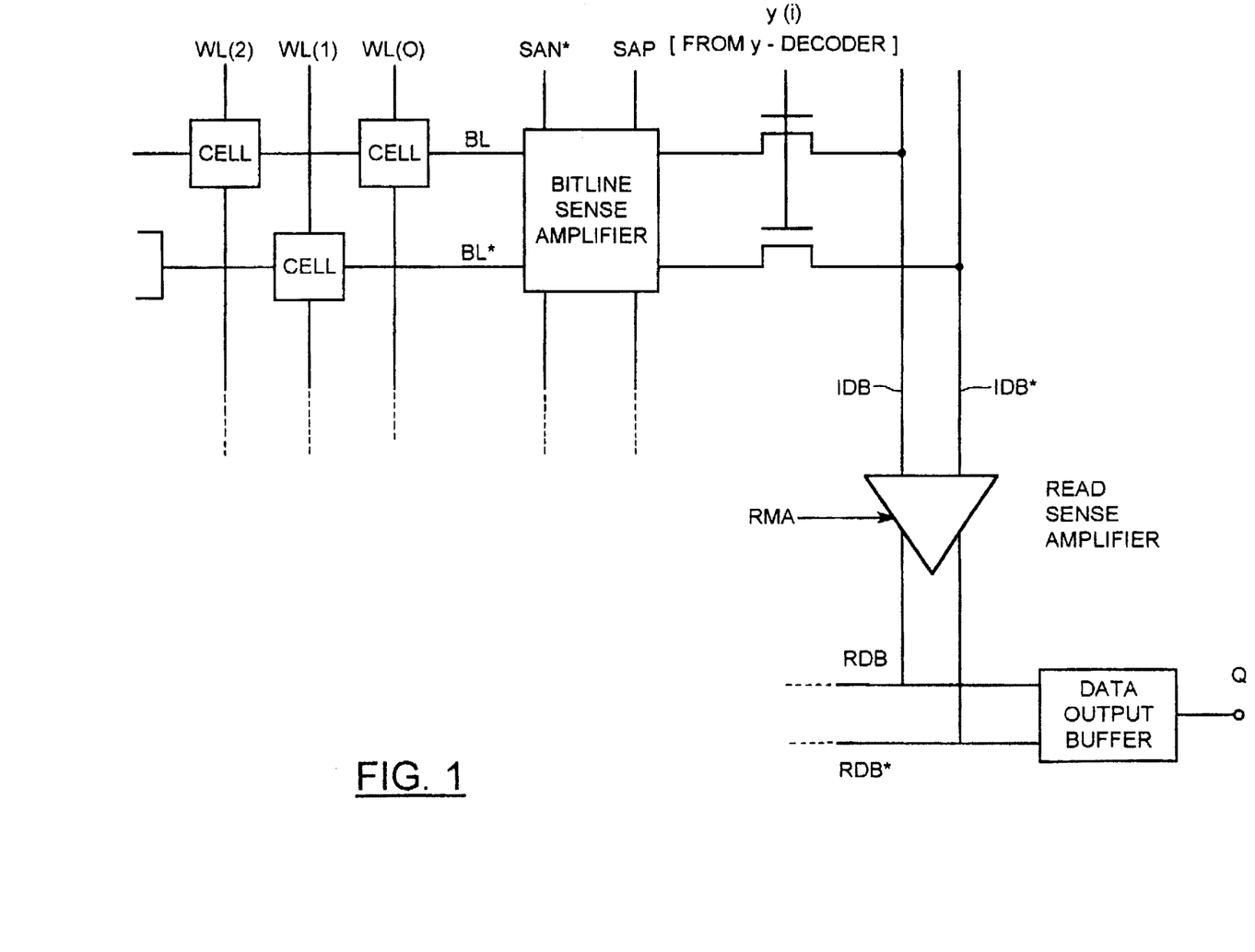
FIG. 1 is a block diagram of a section of a typical dynamic random access memory having a read sense amplifier.

FIG. 1 shows a section of a typical DRAM having a read sense amplifier as is commonly used in the art, as described above.

Figure 2:
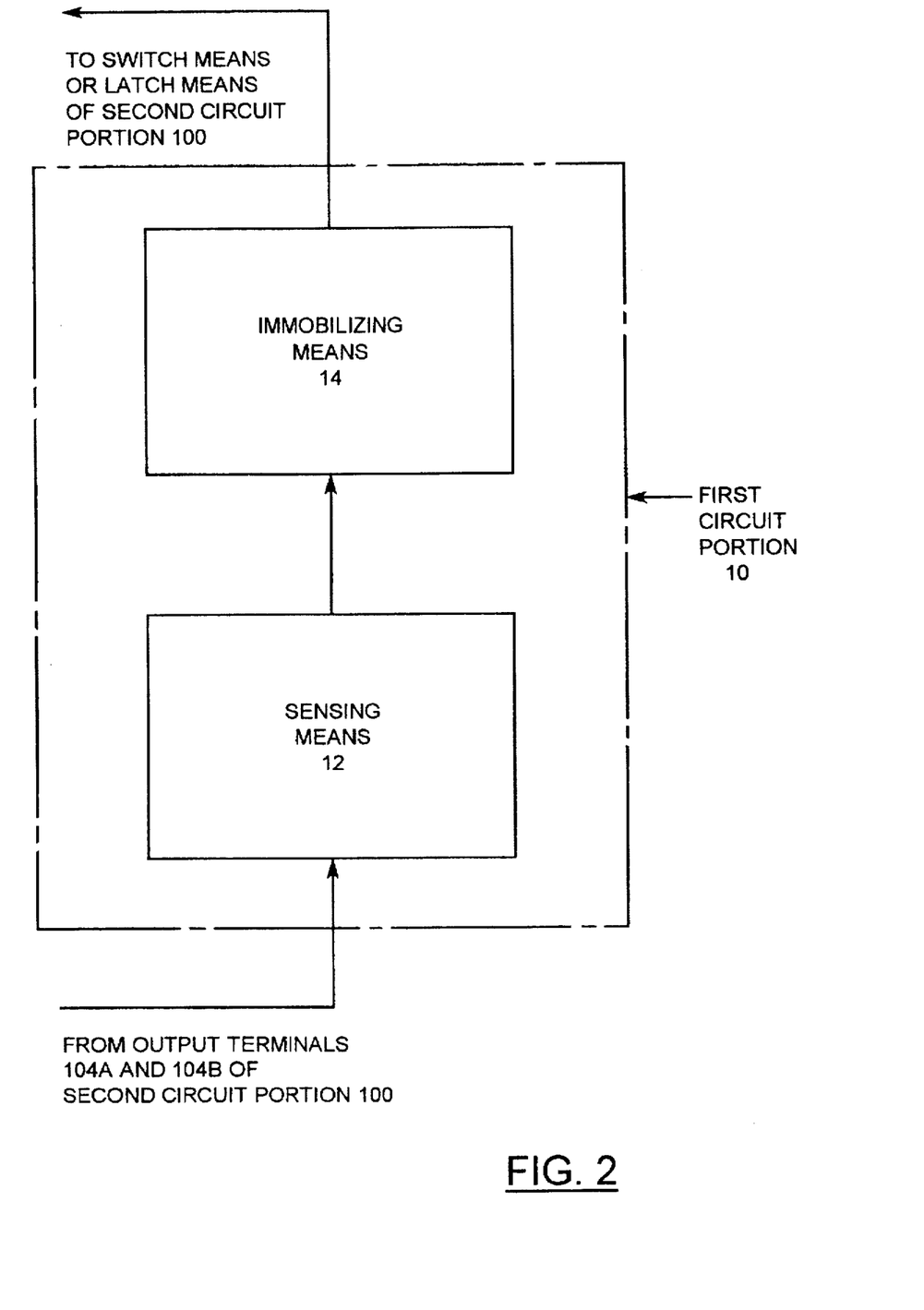
FIG. 2 is a block diagram of a first circuit portion according to a preferred embodiment of the present invention.

FIG. 2 is a block diagram of electric circuit portion 10 (shown for convenience in a ring of hatched lines) for connection to and use with another electric circuit portion, not shown. The two portions are included in a self-timed circuit according to the invention. Here, "self-timed" means that circuit portion 10 responds to the state of an output of the other circuit portion to control the operation of the other circuit portion. The timing of such response depends on the timing characteristics of the circuit portion 10, whose elements are configured as an internal feedback loop, as will be described below. This is in contrast to the prior art, in which the activation and deactivation of the controlled circuit portion are typically governed by an external signal such as a clock.

Figure 4:
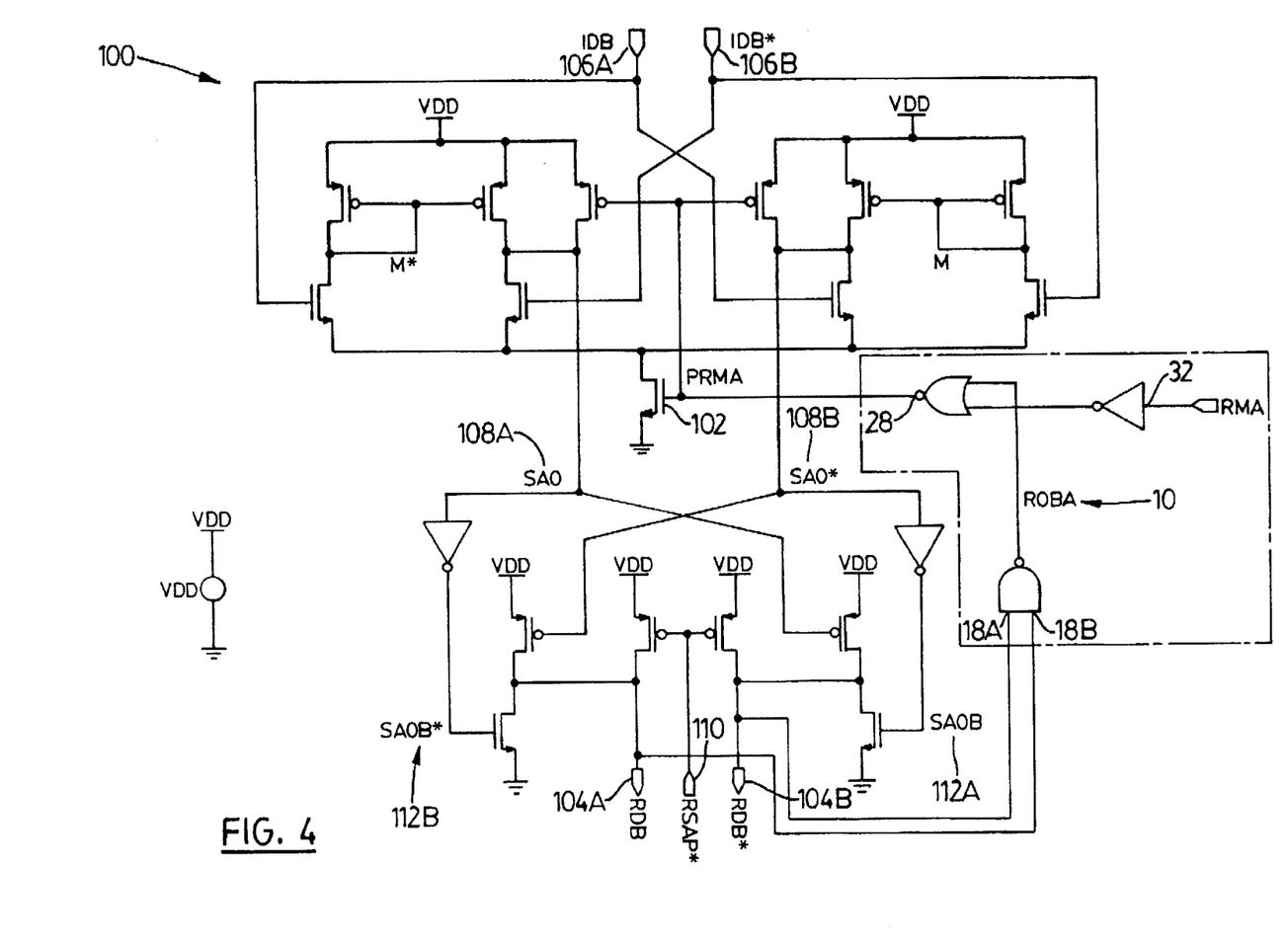
FIG. 4 is a detailed circuit diagram of the feedback control application of the invention in which the first circuit portion of FIG. 3 is operatively connected to a CMOS read sense amplifier.

A first example of the second circuit portion 100 is shown in FIG. 4, where it is the part of the circuit outside the hatched lines. Here, the second circuit portion 100 includes switch means 102 that enables the second circuit portion 100 when turned on. In a controlled example, shown in FIG. 6A, the circuit portion 100 includes, in place of the switch means 102, latch means 103. When activated, the latch means 103 latches an output or outputs of the circuit portion 100 at the output voltage level(s) then present, the corresponding logic states therefore remaining fixed.

Referring again to FIG. 2, the first circuit portion 10 includes sensing means 12 for sensing a change in the value of, an output signal of the second electric circuit portion 100 corresponding to a change between logic states. The first circuit portion also includes immobilizing means 14 that is responsive to the sensing means 12. The immobilizing means 14 temporarily disables the circuit portion 100 shown in FIG. 4 by turning off the switch means 102 after (a) there has been such a change in the logic state of the output signal of the second circuit portion 100 and (b) the output signal of the circuit portion 100 has acquired a value that corresponds to a predetermined logic state. Similarly, when used with the second circuit portion of FIG. 6A, the immobilizing means 14, in response to a signal from the circuit portion 100 received by the sensing means 12, activates the latch means 103 to fix temporarily the logic state(s) of the output(s) of the circuit portion 100. Activation of the sensing means 12 thus initiates the self-timing feature whereby the operation of the second circuit portion 100 is controlled.

Figure 3:
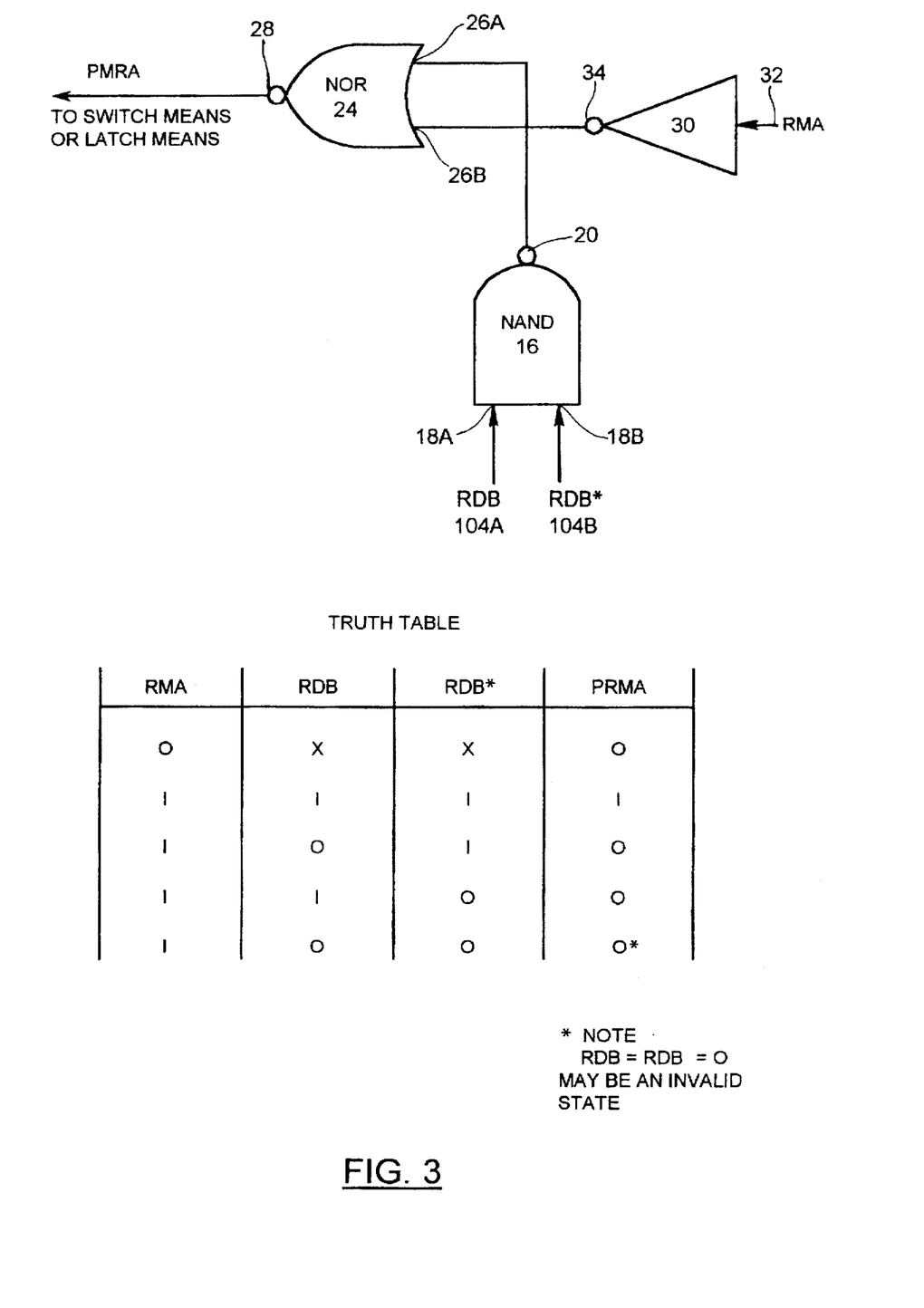
FIG. 3 is the logic circuit and associated truth table of a feedback control circuit portion of a preferred embodiment according to the present invention.

FIG. 3 shows a first preferred embodiment of a first circuit portion according to the invention, in which the sensing means 12 includes a CMOS NAND logic gate 16 having two input terminals 18A, 18B and an output terminal 20. The input terminals are respectively connected to two output terminals 104A, 104B of the second circuit portion 100. The immobilizing means includes a NOR logic gate 24 having two input terminals 26A, 26B and an output terminal 28. The NOR gate input terminal 26A is connected to the NAND gate output terminal 20. The NOR gate output terminal 28 is connected to the switch means 102.

The immobilizing means 14 also includes an inverting logic gate 30 having an input terminal 32 and an output terminal 34. The inverter input terminal 32 is adapted to receive an external input signal that, in the absence of the first circuit portion 10 (the situation of FIG. 1), would be sent to the switch means 102 and would function to enable/disable the second circuit portion 100. The inverter output terminal 34 is connected to the NOR gate input terminal 26B. The immobilizing means 14 overrides the effect of the external input signal, which otherwise would turn on the switch means 102 of the circuit portion 100.

Referring to FIG. 4, the first circuit portion 10 of FIG. 3 (identified by a ring of hatched lines) is shown operatively connected to the second circuit portion 100. In this application, the circuit portion 100 is a typical CMOS read sense amplifier. Input databuses IDB 106A and IDB* 106B connect the read sense amplifier 100 to the portion of the DRAM discussed in the Background section, not shown. The output terminals of the sense amplifier 104A, 104B that are connected to the NAND gate input terminals 18A, 18B are read databuses RDB and RDB*, respectively. The NOR gate output terminal 28 is connected to a P-channel CMOS transistor which functions as the switch means 102.

The external input signal received by the inverter input terminal 32, that is, the RMA (read main amplifier) signal of the sense amplifier, is typically a square periodic waveform that alternates between values corresponding to logic 1 and logic 0. In the absence of the first circuit portion 10, an RMA signal with a value corresponding to logic 1 would be capable of switching on the transistor 102 and enabling the sense amplifier 100. However, the presence of the first circuit portion 10 provides for processing of the RMA signal, producing a subsequent PRMA signal sent via the NOR output terminal 28 to the transistor 102.

In operation, the read sense amplifier 100 can quickly amplify the small voltage differential between IDB 106A and IDB* 106B once the RMA signal is brought to logic 1. In this example, the RMA signal also serves to precharge SAO and SAO* (sense amplifier output) nodes 108A and 108B, respectively, to logic 1 when the sense amplifier 100 is not turned on. The read databuses RDB 104A and RDB* 104B are independently precharged to logic 1 by a signal from RSAP* 110 (read sense amplifier precharge).

When the RMA signal is at logic 0, the RDB 104A and RDB* 104B output signals are in a Hi-Z state, providing RSAP* is not at a logic 0 level. That is, SAO 108A and SAO* 108B are at logic 1, while transistor gates SAOB 112A and SAOB* 112B are at logic 0. When the RMA signal rises, IDB and IDB* are amplified to SAO and SAO*. Since the voltage levels achieved on SAO 108A and SAO* 108B are not full CMOS levels, a second stage of amplification is required to pull either RDB 104A or RDB* 104B to logic 0, depending on the value of the data on the IDB and IDB* nodes 106A, 106B.

In the circuit shown in FIG. 4, when either RDB 104A or RDB* 104B falls (i.e., after the circuit has successfully sensed the respective states of the input databuses IDB 106A and IDB* 106B initiated by a rising RMA signal), node RDBA 20 rises and pulls the PRMA signal down to logic 0, provided that the RMA signal is still at logic 1, thus turning off the read sense amplifier 100 and preventing DC current from being wasted. The trip point of the NAND gate 16 and the delay in the path from the read databuses 104A, 104B to the PRMA signal provide all of the timing margin required to ensure that the sense amplifier 100 is turned off only after CMOS levels have been obtained on RDB 104A and RDB* 104B. Simple CMOS latches, not shown, on the RDB and RDB* nodes 104A, 104B respectively maintain the voltage levels on RDB 104A and RDB* 104B after the read sense amplifier 100 is put into tristate by the PRMA signal. If the sensing operation must be interrupted, the RMA signal can still disable the sensing operation by falling to a low CMOS level which unconditionally pulls the PRMA signal to logic 0.

Figure 5A:
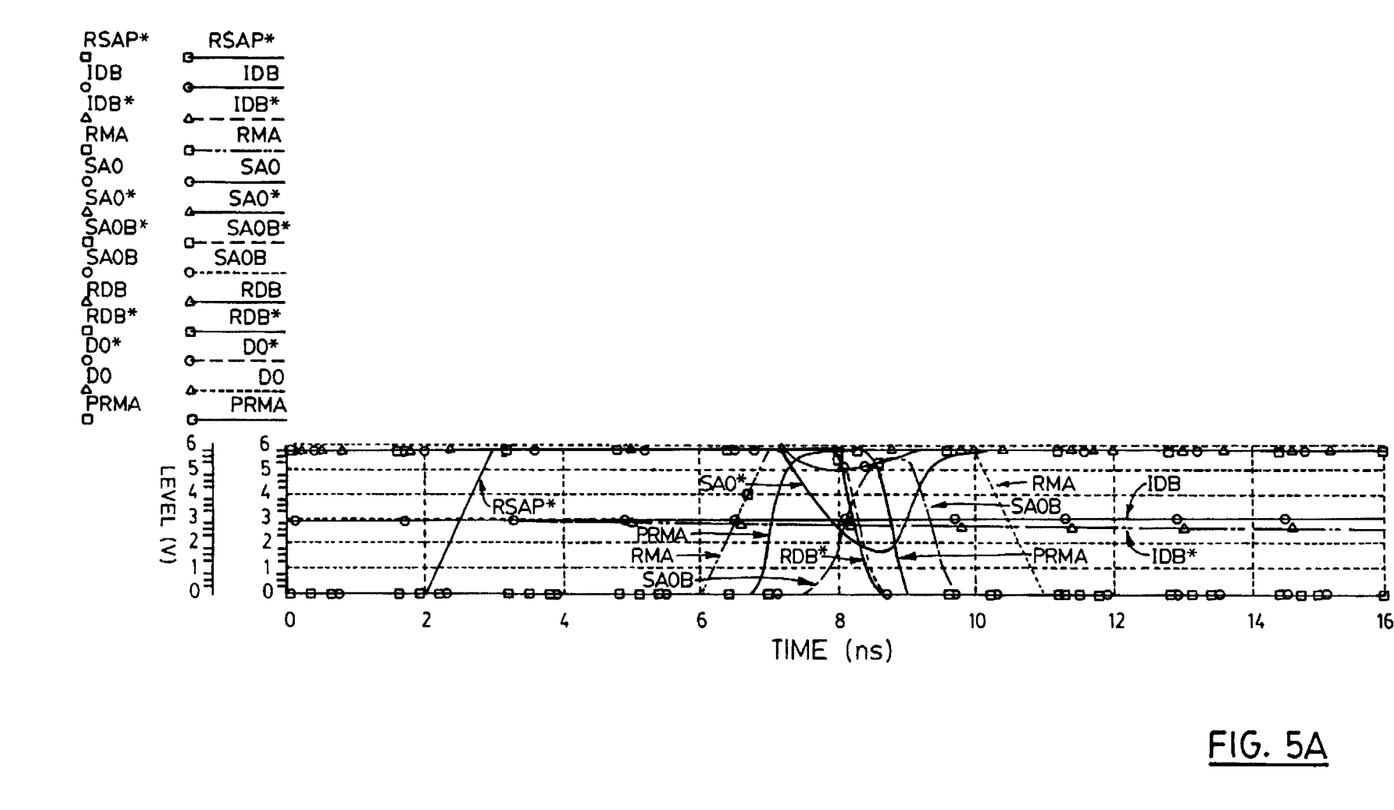
FIG. 5A is a graph of the results of a simulation showing the voltage present at different locations of the circuit of FIG. 4 over time.
Figure 5B:
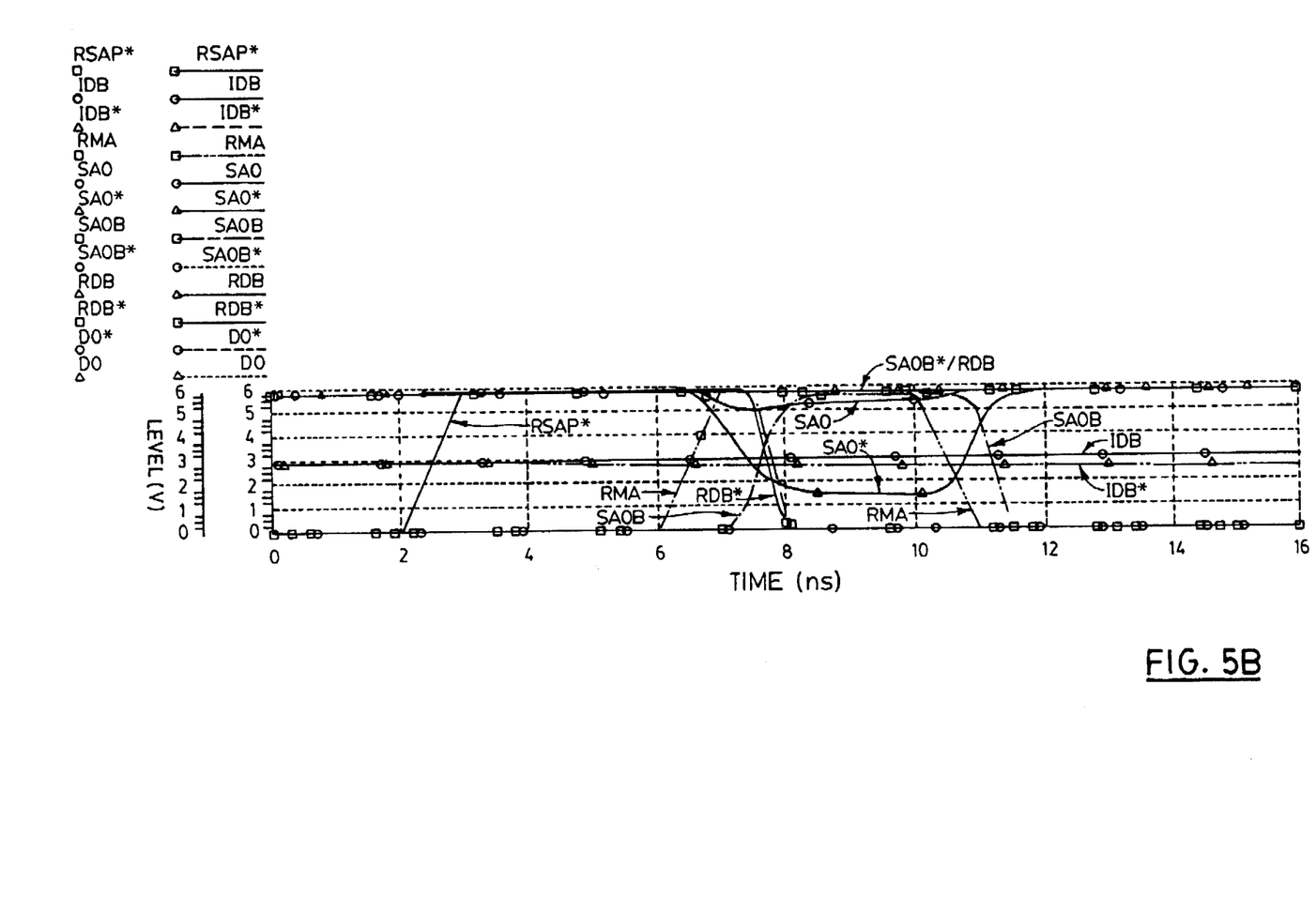
FIG. 5B is a graph of a simulation shoving the voltage present at different locations of a circuit, not shown, that is the circuit of FIG. 4 without the first circuit portion of the invention shown in FIG. 3.

A simulation result of the circuit of FIG. 4 is shown in FIG. 5A. At the 8.5 nsec time point, the RDB* 104B has fallen to logic 0. At the 9 nsec time point, the PRMA signal has also fallen to logic 0, while the RMA signal remains high at logic 1 until the 10.5 nsec time point. The PRMA pulse width is exactly the minimum required to perform the desired function. This is in contrast to the situation depicted in FIG. 5B, where the circuit remains active between the 8 nsec and 10 nsec time points, despite the fact that the output of the second circuit portion 100 has changed from logic 1 to logic 0. FIGS. 5A and 5B therefore demonstrate a reduction in power consumption achieved between the 9 and 10.5 nsec time points through use of the present invention. In the case where many such circuits are used in parallel, the power savings is correspondingly higher.

With this improvement to the overall circuit, the RMA signal must be generated slightly faster than it would be if the self-timed first circuit portion 10 were not present to compensate for the two gate delay in the RMA to PRMA path. In addition, the pulse length of the RMA signal is less critical, with the only requirement being that it stay at logic 1 at least as long as the PRMA signal is at logic 1 to permit the self-timing aspect of the first circuit portion 10 to establish when to disable the sensing operation.

Figure 6A:
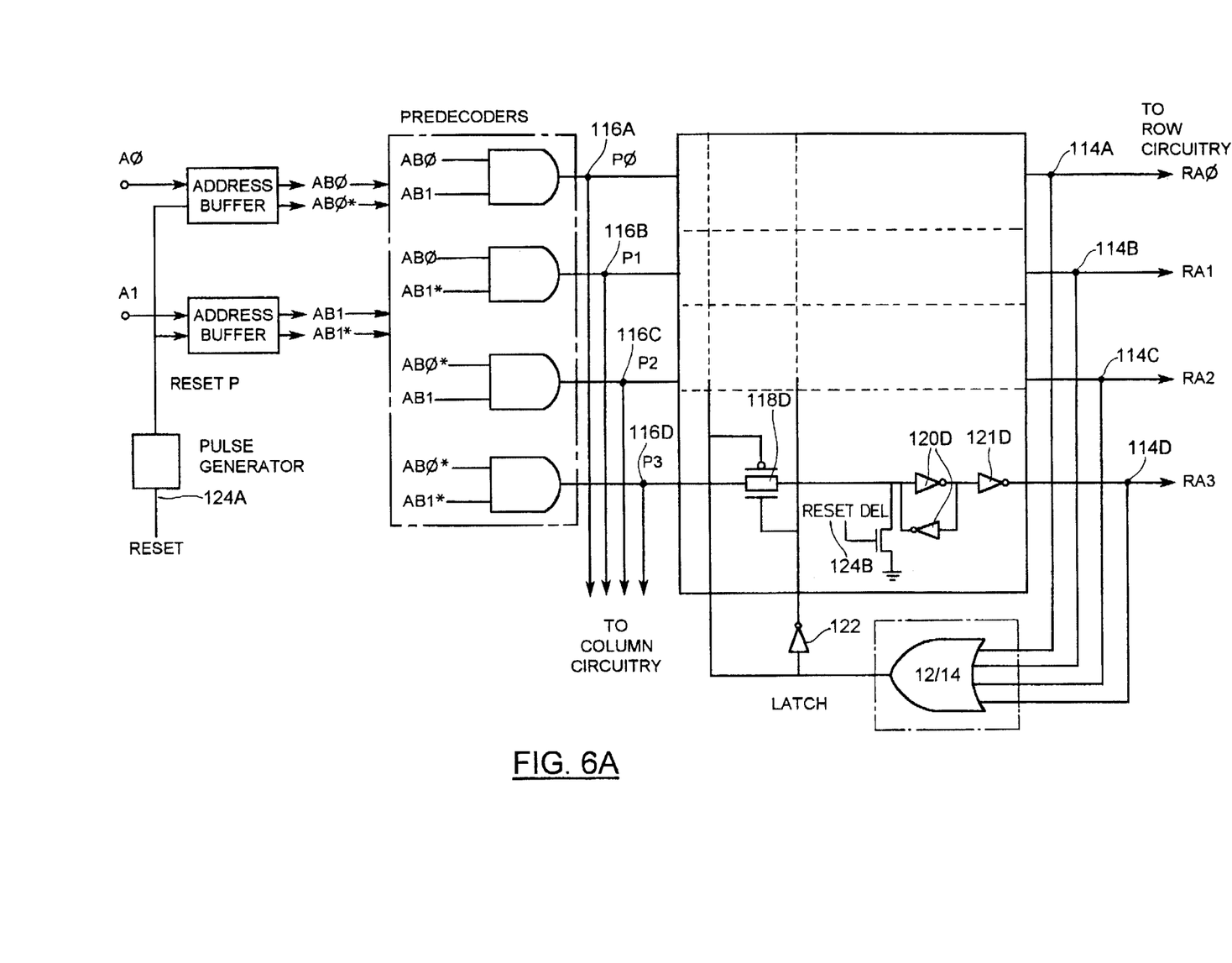
FIG. 6A is a block diagram of a second application of the invention for latching the states of predecoded address lines in a DRAM.
Figure 6B:
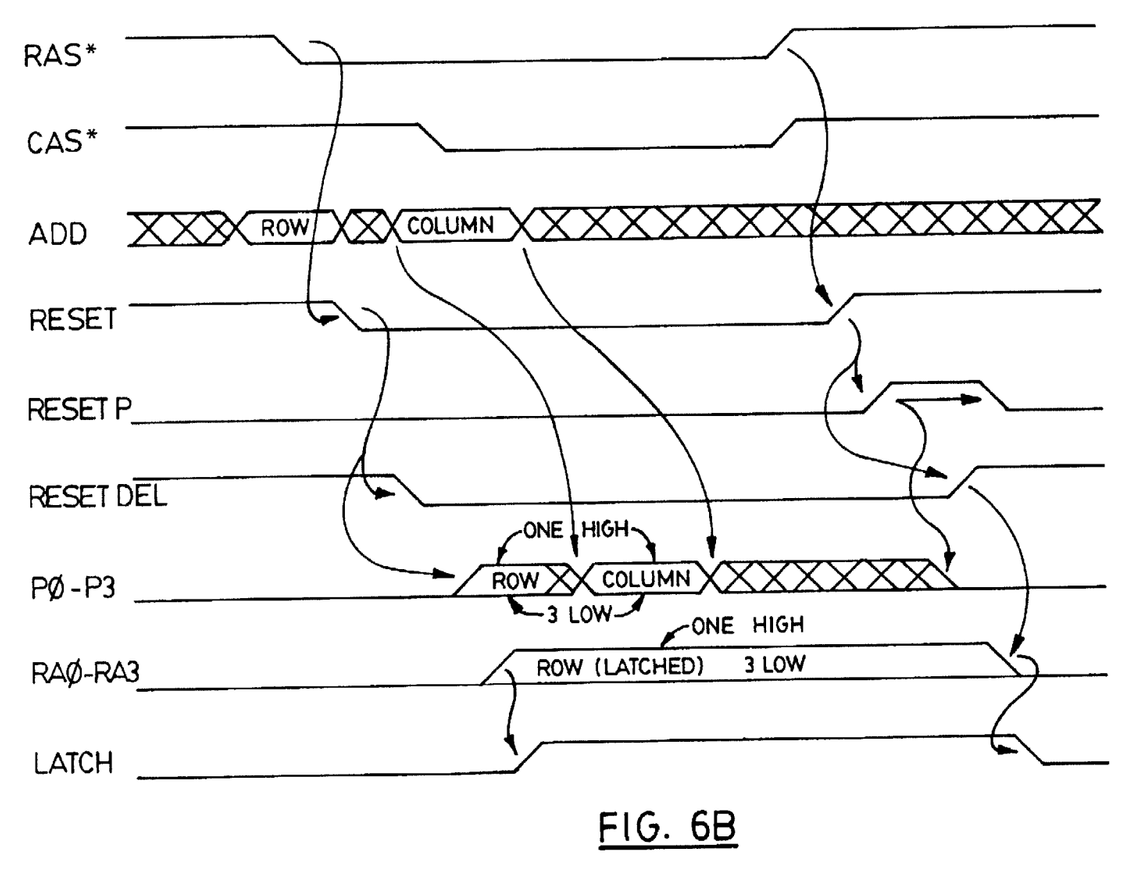
FIG. 6B is graph of the results of a simulation showing the voltage present at different locations of the circuit of FIG. 6A over time.

A second example of an application of the invention is in a DRAM using multiplexed address buffers and predecoders. Self-timed control according to the invention is used for temporary latching of the states of predecoded row address lines, thereby freeing the address buffers and predecoders to perform a column addressing function. FIG. 6A is a block diagram of such an application, and FIG. 6B its corresponding timing diagram.

Referring to FIG. 6A, a second preferred embodiment of the first circuit portion 10 is identified by a ring of hatched lines. The second circuit portion 100, outside the hatched lines, includes four row address lines RA0, RA1, RA2, RA3, which are indicated by reference characters 114A, 114B, 114C and 114D, respectively. The row address lines 114A-114D have respective input nodes P0, P1, P2 and P3, indicated by reference characters 116A, 116B, 116C and 116D, respective complementary pass gates 118, respective reset means 124 (not shown in detail), and respective pairs 120 of cross-coupled inverters each with an associated buffer inverter 121. (FIG. 6A only depicts the complementary pass gate 118D, the pair 120D of cross-coupled inverters, the buffer inverter 121D and the reset means 124 of row address line RA3 114D. However, it is to be understood that identical pass gates, pairs of cross-coupled inverters with buffer inverters and reset means govern the operation of RA0 114A, RA1 114B and RA2 114C.)

initially, the address lines 114A-114D are each at a voltage level corresponding to logic 0. If one or more of the address lines 114 rises to a voltage corresponding to logic 1, this is sensed by the sensing means 12. In this embodiment of the invention, a four-input OR gate is both the sensing means 12 and the immobilizing means 14. The output of the OR gate 12/14 then changes from logic 0 to logic 1, and this signal is sent to the respective p-channel inputs of the four pass gates 118A-118D. The signal is also sent to inverting logic gate 122, such that a signal corresponding to logic 0 is sent to the respective n-channel inputs of the four pass gates 118A-118D, thereby disabling the pass gates 118. The pairs 120 of cross-coupled inverters operate to maintain the respective states of the row address lines 114 when the pass gates are disabled. Thus, the combination of the pass gates 118 and the pairs 120 of cross-coupled inverters operates as the latch means 103. While the latch means 103 is engaged, the address buffers and predecoders are free to perform a column addressing function.

The reset function 124 operates both to reset the logic states of the row address lines 114A-114D to logic 0 via 124B and to reset the logic states of the input nodes 116A-116D to logic 0 via 124A and the address buffers. The output of the OR gate 12/14 is thereby switched to logic 0, which disengages the latch means 103, once again freeing the circuit to perform a row addressing function.

An example of a third application of the invention is the case where the respective operations of several parallel circuits are controlled simultaneously by sampling the output of only one of these circuits. This application requires that all circuits respond in a similar manner, so it is possible to control all of the circuits by monitoring the performance of a single circuit.

A person skilled in the art would be able to construct functional equivalents of the embodiments of the invention described above. For example, in the read sense amplifier application, the NOR gate 24 could be replaced by the combination of an AND gate having two input terminals and two inverters respectively connected to the two AND gate input terminals. Similarly, in the DRAM circuit with multiplexed address buffers, the complementary pass gate could be replaced by either a p-channel or an n-channel pass gate plus input inverting gate.

The present invention is not limited to CMOS technology, integrated circuits or memory devices, and has equivalent utility in other circuit designs. Self-timed control according to the invention can be provided whenever one or more signals begin in a known state (i.e., all at VSS potential) and a control signal is desired when one or more of the signals changes state. The control signal is then fed back to the original circuit to perform a function such as disabling, latching, etc.

It is to be appreciated that the above description relates to a preferred embodiment of the present invention, and that many other embodiments and variations are possible that employ the principles of the invention and fall within its spirit and scope as defined by the following claims.

What is claimed is:

1. A self-timed electric circuit, comprising:
    a first electric circuit portion having a plurality of output terminals with corresponding output signals, each of the output signals representing a logic state, the first electric circuit portion having a switch means for enabling said first electric circuit portion when the switch means is turned on and for disabling said first electric circuit portion when the switch means is turned off
    an external input terminal, the external input terminal having a corresponding external input signal;
    a second electric circuit portion having:
        (a) sensing means for detecting a change in any one of said output signals of the first electric circuit portion, the change corresponding to a change in the logic state represented by said any one output signal, the sensing means having input terminals and an output terminal, said input terminals each being connected to a respective output terminal of said first circuit portion, each of said connected input terminals of the sensing means receiving an input signal constituting the respective output signal corresponding to each output terminal of the first electric circuit portion, the sensing means constituting means for performing the equivalent of a NAND logic function on each logic state corresponding to the respective input signal of the sensing means; and
        (b) immobilizing means responsive to said sensing means for disabling the first electric circuit portion by turning off the switch means, the immobilizing means having an input terminal connected to the output terminal of the sensing means and having an output terminal connected to the switch means of said first electric circuit portion;
    wherein the immobilizing means disables the first electric circuit portion when the sensing means detects said change in the logic state represented by said any one output signal of the first electric circuit portion and when said any one output signal has acquired a value corresponding to a predetermined logic state, the sensing means constituting means for overriding the effect of the external input signal to the switch means of the first electric circuit portion, which external input signal would otherwise be effective to turn on the switch means.

2. The circuit of claim 1, wherein:
    (a) the switch means of the first electric circuit portion is turned on by a signal with a value corresponding to logic 1 and is turned off by a signal with a value corresponding to logic 0; and
    (b) the immobilizing means causes a signal with a value corresponding to logic 0 to be input to the switch means at a time when the external input signal has a value corresponding to logic 1.

3. The circuit of claim 2, wherein:
    (a) the external input signal to the switch means is a generally square periodic wave form that alternates between values corresponding to logic 1 and logic 0;
    (b) the immobilizing means has a second input terminal connected to the external input terminal and receiving the external input signal;
    (c) the immobilizing means performs the equivalent of a NOR function on logic states represented by signals received by the input terminals of the immobilizing means; and
    (d) the predetermined logic state of any one of said input signals received by the said connected input terminals of the sensing means is logic 0.

4. The circuit of claim 1, wherein the predetermined logic state of any one of said input signals received by the said connected input terminals of the sensing means is logic 0.

5. The circuit of claim 1, wherein the first electric circuit portion is a read sense amplifier in a dynamic random access memory (DRAM).

6. The circuit of claim 5, wherein the sense amplifier is a CMOS amplifier.

7. The circuit of claim 1, wherein the sensing means is a NAND logic gate.

8. A self-timed electric circuit, comprising:
    a first electric circuit portion which is part of a random access memory and having a plurality of first address lines therefor, the first electric circuit portion having multiplexed address buffers connected to predecoders, the first electric circuit portion having a plurality of output terminals with corresponding output signals and having a plurality of latch means with corresponding latch controls for engaging and disengaging each latch means, the latch means constituting means for latching output states of said output signals when the latch means are engaged, each of the latch means being connected respectively to each of the first address lines, said first address lines each being connected to a respective predecoder at inputs of said latch means;
    a plurality of second address lines for the random access memory, each of the second address lines being connected, at inputs of said latch means, to a respective first address line of the first electric circuit portion;

a second electric circuit portion having:
  (a) sensing means having a plurality of input terminals and an output terminal, the input terminals each being connected, at outputs of said latch means, to a respective output terminal of the first electric circuit portion, the sensing means constituting means for performing the equivalent of an OR logic function on the output states of said output signals;
  (b) activating means responsive to the sensing means for engaging the latch means by activating the latch controls thereof, the activating means having an input terminal connected to the output terminal of the sensing means, and having an output terminal connected to each of said first address lines at the latch control of the latch means;

wherein the activating means engages the latch means to thereby latch the output states of said output signals when the sensing means detects a change in the output state of any one of said output signals and said any one output signal has acquired an output state corresponding to a predetermined logic state, and wherein said latching of the output states of the output signals frees the address buffers and predecoders to perform an addressing function by means of said second address lines while the latch means are engaged.

9. The circuit of claim 8 wherein:
  (a) the latch means of the first electric circuit portion are activated by a signal with a value corresponding to logic 1; and
  (b) the activating means causes a signal with a value corresponding to logic 1 to be input to the latch means.

10. The circuit of claim 9, wherein the predetermined logic state of said any one output signal is logic 1.

11. The circuit of claim 8 wherein the predetermined logic state of said any one output signal is logic 1.

12. The circuit of claim 8, wherein the random access memory is a dynamic random access memory DRAM.

13. The circuit of claim 12, wherein the DRAM is implemented in CMOS.

14. The circuit of claim 8, wherein both the sensing means and the activating means are implemented with one OR logic function.

15. The circuit of claim 8, wherein the latch means includes a pass gate connected to a pair of cross-coupled inverters.

16. A self-timed control mechanism for a CMOS sense amplifier having two output terminals and a switch transistor biased for turning the sense amplifier on and off in response to signals with values corresponding respectively to logic 1 and 0, the mechanism comprising:

(a) a NAND logic gate having two input terminals and an output terminal, each input terminal being connected to a respective sense amplifier output terminal that is precharged to logic 1;
  (b) a NOR logic gate having first and second input terminals and an output terminal, the first input terminal being connected to the output terminal of the NAND gate and the output terminal being connected to a gate of the switch transistor; and
  (c) an inverting logic gate having an input terminal for receiving an externally generated generally square periodic waveform whose value alternates between values corresponding to logic 1 and logic 0, and an output terminal that is connected to the second input terminal of the NOR gate.

17. A self-timed feedback control mechanism for latching the logic states of address lines in a CMOS DRAM, the mechanism comprising:
  (a) a plurality of row address lines;
  (b) a plurality of column address lines;
  (c) a plurality of latch means corresponding to each of the row address lines and connected thereto, said latch means having a latch control for engaging and disengaging the latch means;
  (d) an OR logic gate having a plurality of input terminals and an output terminal, the input terminals each being connected, at outputs of said latch means, to a respective row address line, the output terminal being connected to the latch control of said latch means;

wherein the column address lines are each respectively connected to the row address lines at inputs of said latch means, and the latch means are activated to latch the respective logic states of said corresponding row address lines when the said output of the OR logic gate signals a change in logic state of one of said row address lines which results in a value thereof corresponding to a predetermined logic state, and wherein the column address lines perform an addressing function while the latch means are activated.

18. The self-timed feedback control mechanism according to claim 17, wherein the CMOS DRAM has multiplexed address buffers connected to predecoders, said row address lines each being connected to a respective predecoder at inputs of said latch means.

* * * * *